(12) United States Patent
Fang et al.

(10) Patent No.: US 11,354,461 B2
(45) Date of Patent: Jun. 7, 2022

(54) METHOD AND DEVICE FOR SIMULATING A DISTRIBUTION OF OBSTACLES

(71) Applicant: Baidu Online Network Technology (Beijing) Co., Ltd, Beijing (CN)

(72) Inventors: Jin Fang, Beijing (CN); Feilong Yan, Beijing (CN); Ruigang Yang, Beijing (CN); Liang Wang, Beijing (CN); Yu Ma, Beijing (CN)

(73) Assignee: Baidu Online Network Technology (Beijing) Co., Ltd., Beijing (CN)

( * ) Notice: Subject to any disclaimer, the term of this patent is extended or adjusted under 35 U.S.C. 154(b) by 250 days.

(21) Appl. No.: 16/514,112

(22) Filed: Jul. 17, 2019

(65) Prior Publication Data

US 2020/0082038 A1 Mar. 12, 2020

(30) Foreign Application Priority Data

Sep. 7, 2018 (CN) .......................... 201811044639.4

(51) Int. Cl.
*G06F 30/20* (2020.01)
(52) U.S. Cl.
CPC .................................. *G06F 30/20* (2020.01)
(58) Field of Classification Search
CPC ............. G06F 30/20; G06F 2212/173; G06T 2207/30261; G06T 19/20; G05B 13/042; G06K 9/00805
See application file for complete search history.

(56) References Cited

U.S. PATENT DOCUMENTS 9,255,989 B2 * 2/2016 Joshi .................... G01S 13/931
9,760,806 B1 9/2017 Ning et al.
(Continued)

FOREIGN PATENT DOCUMENTS

CN 104933708 A 9/2015
CN 105957145 A 9/2016
(Continued)

OTHER PUBLICATIONS

Hancock "Laser Intensity-Based Obstacle Detection and Tracking". Carnegie Mellon University. Jan. 26, 1999. 180 Pages. (Year: 1999).*

(Continued)

*Primary Examiner* — Eunhee Kim
(74) *Attorney, Agent, or Firm* — Akerman LLP (57) ABSTRACT

A method and system for simulating a distribution of obstacles are provided. The method includes: acquiring a plurality of point clouds of a plurality of frames, wherein each point cloud includes a plurality of original obstacles; acquiring real labeling data of an acquisition vehicle, and obtaining data of a simulation position of the acquisition vehicle based on the real labeling data and a movement rule of the acquisition vehicle; determining the number of obstacles to be simulated based on the data of the simulation position of the acquisition vehicle; selecting the determined number of obstacles to be simulated, from a range with the simulation position of the acquisition vehicle as a center, wherein the range is less than or equal to a maximum scanning range of the vehicle; and acquiring real labeling data of the selected obstacles, and obtaining a position distribution of the selected obstacles.

9 Claims, 3 Drawing Sheets

(56) References Cited

U.S. PATENT DOCUMENTS

| | | | |
|---|---|---|---|
| 9,865,085 B1* | 1/2018 | Eng | G06T 19/00 |
| 10,169,678 B1* | 1/2019 | Sachdeva | H04N 13/361 |
| 10,186,049 B1* | 1/2019 | Boardman | G06T 7/75 |
| 2014/0032012 A1 | 1/2014 | Joshi et al. | |
| 2018/0349526 A1* | 12/2018 | Atsmon | G06T 17/05 |
| 2019/0220029 A1* | 7/2019 | Fukuhara | G06K 9/00805 |
| 2019/0236380 A1 | 8/2019 | Fukuhara et al. | |

FOREIGN PATENT DOCUMENTS

| | | | | |
|---|---|---|---|---|
| CN | 106845412 A | | 6/2017 | |
| CN | 106997049 A | | 8/2017 | |
| DE | 102013107861 A1 | | 1/2014 | |
| JP | 2014025925 A | | 2/2014 | |
| JP | 2015079223 A | | 4/2015 | |
| JP | 2016206999 A | * | 12/2016 | G05D 1/02 |
| JP | 2018060511 A | | 4/2018 | |
| JP | 2018060512 A | | 4/2018 | |
| WO | 2018/066351 A1 | | 4/2018 | |
| WO | 2018/066352 A1 | | 4/2018 | |
| WO | 2018/138584 A1 | | 8/2018 | |

OTHER PUBLICATIONS

Yue et al. "A LiDAR Point Cloud Generator: from a Virtual World to Autonomous Driving". Special Session 2: Social-Media Visual Summarization / Large-Scale 3D Multimedia Analysis and Applications. ICMR'18, Jun. 11-14, 2018, Yokohama, Japan. pp. 458-464. (Year: 2018).*

Notification of the First Office Action dated Aug. 5, 2019 for Chinese Application No. 201811044639.4.

Search Report dated Jul. 25, 2019 for Chinese Application No. 201811044639.4.

Extended European Search Report dated Jan. 31, 2020 issued in connection with European Patent Application No. 19185805.9.

Xiangyu Yue et al., "A LiDAR Point Cloud Generator: from a Virtual World to Autonomous Driving," Cornell University Library, 201 Olin Library Cornell University, Ithaca, NY 14853, Mar. 31, 2018, XP081225058, https://arxiv.org/abs/1804.00103, Abstract.

Notice of Reasons for Refusal dated Oct. 6, 2020 in connection with corresponding Japanese Patent Application No. 2019-133667.

Extended European Search Report dated Feb. 11, 2020 issued in connection with corresponding European Patent Application No. 19185780.4.

Keller et al., "Real-Time Recognition of U.S. Speed Signs," Intelligent Vehicles Symposium, 2008 IEEE, Jun. 4, 2008, pp. 518-523.

* cited by examiner

METHOD AND DEVICE FOR SIMULATING A DISTRIBUTION OF OBSTACLES

CROSS-REFERENCE TO RELATED APPLICATION

This application claims priority to Chinese Patent Application No. 201811044639.4, filed on Sep. 7, 2018, which is hereby incorporated by reference in its entirety.

TECHNICAL FIELD OF THE DISCLOSURE

The present disclosure relates to the technical field of computers, and in particular to a method and device for simulating a distribution of obstacles based on statistics.

BACKGROUND OF THE DISCLOSURE

In an off-line state of a high-precision map, labeling data of obstacles in the map may be collected. The labeling data includes a position where the obstacle is currently located, an orientation, an ID and a type and the like of an obstacle. The type of the obstacle may be a dynamic obstacle such as a vehicle, a pedestrian and a rider, or a static obstacle such as a traffic cone cylinder. How to simulate the number of obstacles and the position distribution of the obstacles so as to resemble the real conditions as much as possible is drawing more and more attention from those skilled in the art.

In the conventional technical solutions, a high-precision map is generally used, and simulation is typically performed by using obstacle arrangement based on a rule. Examples of the obstacle arrangement based on a rule include: vehicle arrangement in a direction of a lane line, and random pedestrian arrangement. However, very limited scenarios can be presented in the obstacle arrangement based on a rule. Since the high-precision map includes only main roads and includes no side roads or branch roads, a simulation result of the position distribution of the same type of obstacles and a simulation result of the number distribution of different types of obstacles differ from real conditions greatly. In addition, the obstacle arrangement based on a rule cannot present all the possible cases in a real scenario in an exhaustive manner, resulting in a low coverage.

SUMMARY OF THE DISCLOSURE

According to embodiments of the present disclosure, a method and device for simulating a distribution of obstacles based on statistics are provided to solve at least the above technical problems in the conventional technologies.

In a first aspect, according to an embodiment of the present disclosure, a method for simulating a distribution of obstacles is provided, which includes:

acquiring a plurality of point clouds of a plurality of frames, wherein each point cloud includes a plurality of original obstacles;

acquiring real labeling data of an acquisition vehicle, and obtaining data of a simulation position of the acquisition vehicle based on the real labeling data of the acquisition vehicle and a movement rule of the acquisition vehicle;

determining the number of obstacles to be simulated based on the data of the simulation position of the acquisition vehicle;

selecting the determined number of obstacles to be simulated, from a range with the simulation position of the acquisition vehicle as a center, wherein the range is less than or equal to a maximum scanning range of the acquisition vehicle; and determining whether adjacent candidate obstacles are overlapped by using the obstacle model; and deleting one of the overlapped candidate obstacles, in a case that the adjacent candidate obstacles are overlapped.

In combination with the first aspect, in a first implementation of the first aspect of the present disclosure, the acquiring real labeling data of an acquisition vehicle further includes:

acquiring absolute coordinates of the acquisition vehicle in a world coordinate system; and labeling the acquisition vehicle by the absolute coordinates of the acquisition vehicle, to obtain the real labeling data of the acquisition vehicle.

In combination with the first implementation of the first aspect, in a second implementation of the first aspect of the present disclosure, the acquiring real labeling data of the selected obstacles further includes:

calculating relative coordinates of the selected obstacles in a coordinate system of the point cloud;

calculating absolute coordinates of the selected obstacles based on the absolute coordinates of the acquisition vehicle and the relative coordinates of the selected obstacles; and obtaining the real labeling data of the selected obstacles based on the absolute coordinates of the selected obstacles.

In combination with the first aspect, in a third implementation of the first aspect of the present disclosure, the determining the number of obstacles to be simulated based on the data of the simulation position of the acquisition vehicle includes:

searching for real labeling data of the acquisition vehicle at the vehicle labeled position identical or adjacent to the position to be simulated; and retrieving a point cloud to which the real labeling data of the acquisition vehicle as searched belongs, and determining the number of the obstacles in the retrieved point cloud as the number of the obstacles to be simulated.

In combination with the first aspect, in a fourth implementation of the first aspect of the present disclosure, before the selecting the determined number of obstacles to be simulated, from a range with the simulation position of the acquisition vehicle as a center, the method further includes:

determining real labeling data of candidate obstacles in the range;

selecting an obstacle model from an obstacle model library, based on the real labeling data of the candidate obstacles; and determining whether adjacent candidate obstacles are overlapped by using the obstacle model; and deleting one of the overlapped candidate obstacles, in a case that the adjacent candidate obstacles are overlapped.

In a second aspect, according to an embodiment of the present disclosure, a device for simulating a distribution of obstacles is provided, which includes:

a point cloud acquisition module, configured to acquire a plurality of point clouds of a plurality of frames, wherein each point cloud includes a plurality of original obstacles;

an acquisition vehicle simulation module, configured to acquire real labeling data of an acquisition vehicle, and to obtain data of a simulation position of the acquisition vehicle based on the real labeling data of the acquisition vehicle and a movement rule of the acquisition vehicle;

a simulation number acquisition module, configured to determine the number of obstacles to be simulated based on the data of the simulation position of the acquisition vehicle;

a simulation obstacle selection module, configured to select the determined number of obstacles to be simulated, from a range with the simulation position of the acquisition vehicle as a center, wherein the range is less than or equal to a maximum scanning range of the acquisition vehicle; and a simulation obstacle position distribution module, configured to acquire real labeling data of the selected obstacles, and obtaining a position distribution of the selected obstacles based on the real labeling data of the selected obstacles.

In combination with the second aspect, in a first implementation of the second aspect of the present disclosure, the device further includes:

an acquisition vehicle labeling module, configured to acquire absolute coordinates of the acquisition vehicle in a world coordinate system, and label the acquisition vehicle by the absolute coordinates of the acquisition vehicle, to obtain the real labeling data of the acquisition vehicle.

In combination with the first implementation of the second aspect, in a second implementation of the second aspect of the present disclosure, the device further includes:

an obstacle labeling module, configured to calculate relative coordinates of the selected obstacles in a coordinate system of the point cloud, to calculate absolute coordinates of the selected obstacles based on the absolute coordinates of the acquisition vehicle and the relative coordinates of the selected obstacles, and to obtain the real labeling data of the selected obstacles based on the absolute coordinates of the selected obstacles.

In combination with the second aspect, in a third implementation of the second aspect of the present disclosure, the simulation number acquisition module includes:

a labeling data searching unit, configured to search for real labeling data of the acquisition vehicle at the vehicle labeled position identical or adjacent to the position to be simulated; and a simulation number calculating unit, configured to retrieve a point cloud to which the real labeling data of the acquisition vehicle as searched belongs, and to determine the number of the obstacles in the retrieved point cloud as the number of the obstacles to be simulated.

In combination with the second aspect, in a fourth implementation of the second aspect of the present disclosure, the device further includes:

an obstacle collision detection module, configured to determine real labeling data of candidate obstacles in the range, to select an obstacle model from an obstacle model library, based on the real labeling data of the candidate obstacles, and to determine whether adjacent candidate obstacles are overlapped by using the obstacle model; and to delete one of the overlapped candidate obstacles, in a case that the adjacent candidate obstacles are overlapped.

In a third aspect, according to an embodiment of the present disclosure, a terminal for simulating a distribution of obstacles is provided, which includes: a processor and a memory for storing a program which supports the device for simulating a distribution of obstacles in executing the method for simulating a distribution of obstacles described above in the first aspect, and the processor is configured to execute the program stored in the memory. The terminal can further include a communication interface for enabling the terminal to communicate with other devices or communication networks.

The functions may be implemented by using hardware or by executing corresponding software by hardware. The hardware or software includes one or more modules corresponding to the functions described above.

In a fourth aspect, according to an embodiment of the present disclosure, a non-volatile computer readable storage medium for storing computer software instructions used for a device for simulating a distribution of obstacles, the computer readable storage medium including a program involved in executing the method for simulating a distribution of obstacles described above in the first aspect by the device for simulating a distribution of obstacles.

One of the above technical solutions has the following advantages or advantageous effects: data of a simulation position of an acquisition vehicle is acquired based on the real labeling data of the acquisition vehicle, and the number of obstacles to be simulated is then determined based on the data of the simulation position of the acquisition vehicle. Finally, the determined number of obstacles to be simulated is selected, from a range with the simulation position of the acquisition vehicle as a center. Real labeling data of the selected obstacles is acquired, and a position distribution of the selected obstacles is then obtained based on the real labeling data of the selected obstacles. Diversity of position simulation of obstacles is increased, such that a simulation result of the number of the obstacles and a simulation result of the position distribution of the obstacles are closer to real conditions.

The above summary is provided only for illustration, and is not intended to limit the present disclosure in any way. In addition to the illustrative aspects, embodiments and features described above, further aspects, embodiments and features of the present disclosure may be readily understood from the following detailed description with reference to the accompanying drawings.

BRIEF DESCRIPTION OF THE DRAWINGS

Unless otherwise specified, identical or similar parts or elements are denoted by identical reference signs throughout several figures of the accompanying drawings. The drawings are not necessarily drawn to scale. It should be understood that these drawings merely illustrate some embodiments of the present disclosure, and should not be construed as limiting the scope of the disclosure.

DETAILED DESCRIPTION OF THE EMBODIMENT(S) OF THE DISCLOSURE

Hereinafter, only some exemplary embodiments are simply described. As can be appreciated by those skilled in the art, the described embodiments may be modified in various different ways without departing from the spirit or scope of the present disclosure. Accordingly, the drawings and the description should be considered as illustrative in nature instead of being restrictive.

First Embodiment

Figure 1:
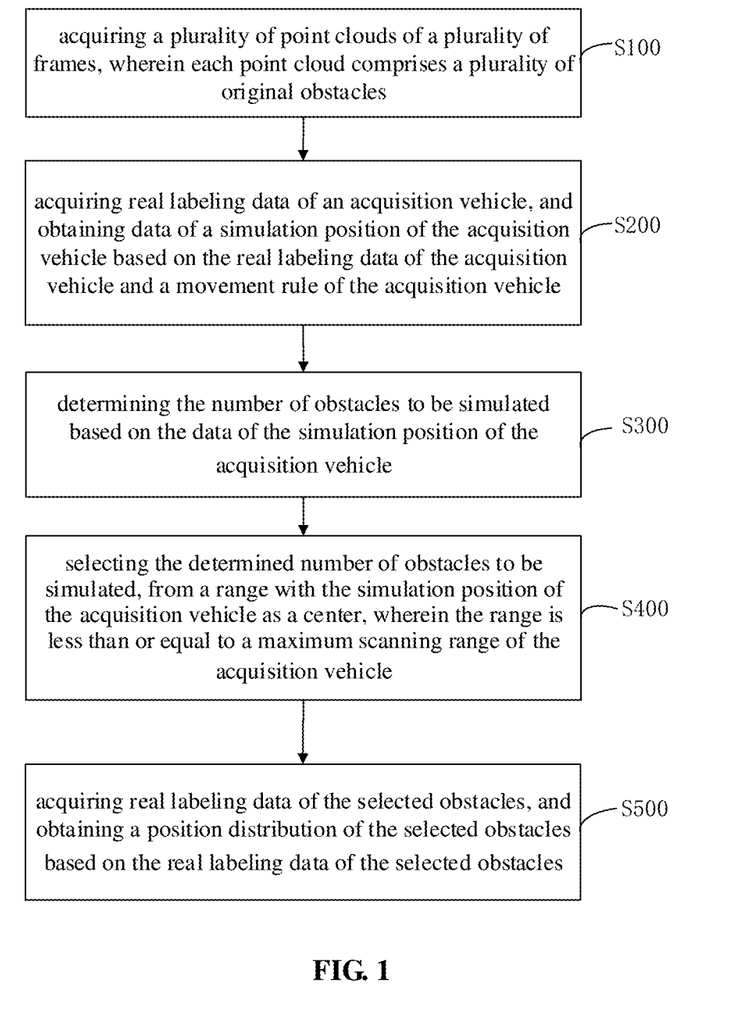
FIG. 1 is a flowchart schematically showing a method for simulating a distribution of obstacles according to an embodiment of the present disclosure.

A method for simulating a distribution of obstacles is provided according to a specific embodiment. The method includes steps S100 to S500.

Step S100: acquiring a plurality of point clouds of a plurality of frames, wherein each point cloud includes a plurality of original obstacles.

When an acquisition vehicle moves along a movement route, the acquisition vehicle may obtain a plurality of point clouds of a plurality of frames by scanning obstacles around by means of a radar. The acquisition vehicle may move along a main road or along a specified side road. Various movement of the acquisition vehicle will fall within the protection scope of the embodiment of the present disclosure.

Step S200: acquiring real labeling data of an acquisition vehicle, and obtaining data of a simulation position of the acquisition vehicle based on the real labeling data of the acquisition vehicle and a movement rule of the acquisition vehicle.

A plurality of absolute coordinates of the acquisition vehicle along the movement route may serve as the data of the simulation position. Moreover, an interpolation operation may be performed to two adjacent absolute coordinates of the acquisition vehicle, that is, coordinates on a line connecting the two adjacent absolute coordinates of the acquisition vehicle serve as the data of the simulation position. In this way, the number of the absolute coordinates of the acquisition vehicle (i.e., positions where the acquisition vehicle may reach) is increased, such that a simulation position of the acquisition vehicle tends to be closer to a real position of the acquisition vehicle.

Step S300: determining the number of obstacles to be simulated based on the data of the simulation position of the acquisition vehicle.

Step S400: selecting the determined number of obstacles to be simulated, from a range with the simulation position of the acquisition vehicle as a center, wherein the range is less than or equal to a maximum scanning range of the acquisition vehicle.

Step S500: acquiring real labeling data of the selected obstacles, and obtaining a position distribution of the selected obstacles based on the real labeling data of the selected obstacles.

In this way, diversity of position simulation of obstacles is increased, such that a simulation result of the number of the obstacles and a simulation result of the position distribution of the obstacles are closer to real conditions.

In an embodiment, the acquiring real labeling data of an acquisition vehicle further includes:

acquiring absolute coordinates of the acquisition vehicle in a world coordinate system; and labeling the acquisition vehicle by the absolute coordinates of the acquisition vehicle, to obtain the real labeling data of the acquisition vehicle.

Each frame of the point cloud acquired by the acquisition vehicle corresponds to a plurality of absolute coordinates. Therefore, a plurality of absolute coordinates of the acquisition vehicle along a movement route are acquired, and each set of absolute coordinates corresponds to one frame of the point clouds.

In an embodiment, the acquiring real labeling data of the selected obstacles further includes:

calculating relative coordinates of the selected obstacles in a coordinate system of the point cloud;

calculating absolute coordinates of the selected obstacles based on the absolute coordinates of the acquisition vehicle and the relative coordinates of the selected obstacles; and obtaining the real labeling data of the selected obstacles based on the absolute coordinates of the selected obstacles.

In each frame of the point clouds, a point cloud coordinate system is established by taking the position of the acquisition vehicle as an origin, and the obstacles have relative coordinates with respect to the acquisition vehicle. The absolute coordinates of the obstacles are obtained based on the absolute coordinates of the acquisition vehicle and the relative coordinates of the obstacle.

In a specific embodiment, the determining the number of obstacles to be simulated based on the data of the simulation position of the acquisition vehicle includes:

searching for real labeling data of the acquisition vehicle at the vehicle labeled position identical or adjacent to the position to be simulated; and retrieving a point cloud to which the real labeling data of the acquisition vehicle as searched belongs, and determining the number of the obstacles in the retrieved point cloud as the number of the obstacles to be simulated.

Firstly, real labeling data of the acquisition vehicle is searched for, at the vehicle labeled position identical with the position to be simulated. If no identical data is found, real labeling data is searched for, at the vehicle labeled position adjacent to the position to be simulated. A point cloud to which the real labeling data of the acquisition vehicle as searched belongs is retrieved, and the number of the obstacles in the retrieved point cloud is determined as the number of the obstacles to be simulated.

In a specific embodiment, before the selecting the determined number of obstacles to be simulated, from a range with the simulation position of the acquisition vehicle as a center, the method further includes:

determining real labeling data of candidate obstacles in the range;

selecting an obstacle model from an obstacle model library, based on the real labeling data of the candidate obstacles; and determining whether adjacent candidate obstacles are overlapped by using the obstacle model; and deleting one of the overlapped candidate obstacles, in a case that the adjacent candidate obstacles are overlapped.

Specifically, all obstacles in the range are acquired, and a collision detection is performed based on the real coordinate data of the obstacles. One of obstacles which may collide another obstacle is deleted. And the number of obstacles to be simulated is determined based on the remaining obstacles. The determined number of obstacles to be simulated is then selected.

Second Embodiment

Figure 2:
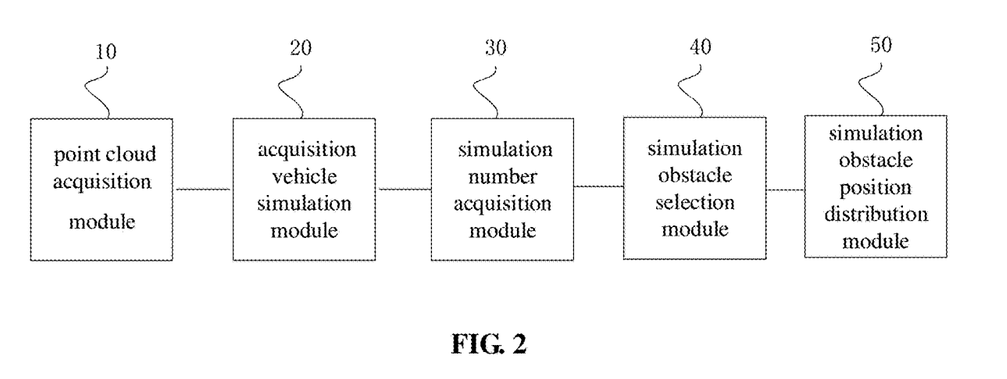
FIG. 2 is a block diagram schematically showing a structure of a device for simulating a distribution of obstacles according to an embodiment of the present disclosure.

As shown in FIG. 2, according to another specific embodiment of the present disclosure, a device for simulating a distribution of obstacles is provided, which includes:

a point cloud acquisition module 10, configured to acquire a plurality of point clouds of a plurality of frames, wherein each point cloud includes a plurality of original obstacles;

an acquisition vehicle simulation module 20, configured to acquire real labeling data of an acquisition vehicle, and to obtain data of a simulation position of the acquisition vehicle based on the real labeling data of the acquisition vehicle and a movement rule of the acquisition vehicle;

a simulation number acquisition module 30, configured to determine the number of obstacles to be simulated based on the data of the simulation position of the acquisition vehicle;

a simulation obstacle selection module 40, configured to select the determined number of obstacles to be simulated, from a range with the simulation position of the acquisition vehicle as a center, wherein the range is less than or equal to a maximum scanning range of the acquisition vehicle; and a simulation obstacle position distribution module 50, configured to acquire real labeling data of the selected obstacles, and obtaining a position distribution of the selected obstacles based on the real labeling data of the selected obstacles.

Figure 3:
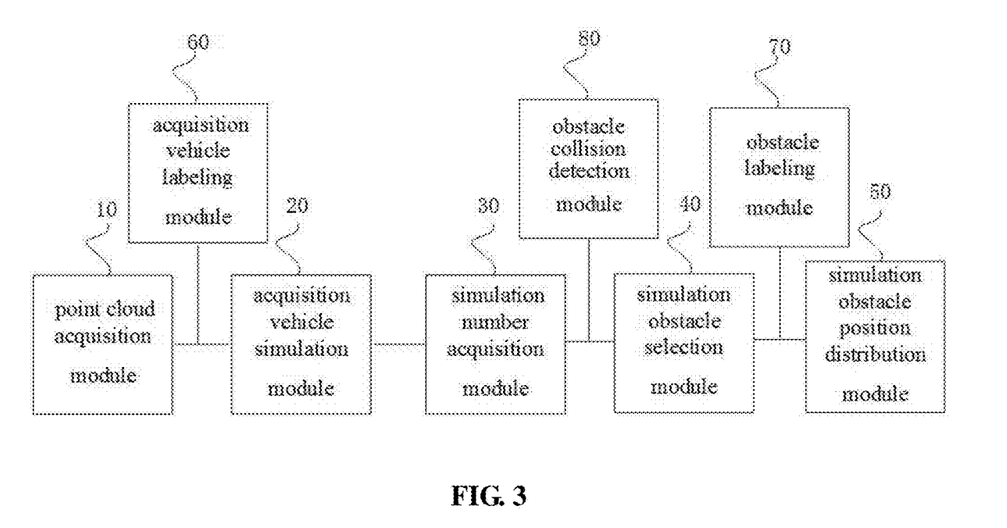
FIG. 3 is a block diagram schematically showing a structure of another device for simulating a distribution of obstacles according to an embodiment of the present disclosure.

As shown in FIG. 3, in an embodiment, the device further includes:

an acquisition vehicle labeling module 60, configured to acquire absolute coordinates of the acquisition vehicle in a world coordinate system, and label the acquisition vehicle by the absolute coordinates of the acquisition vehicle, to obtain the real labeling data of the acquisition vehicle.

As shown in FIG. 3, in an embodiment, the device further includes:

an obstacle labeling module 70, configured to calculate relative coordinates of the selected obstacles in a coordinate system of the point cloud, to calculate absolute coordinates of the selected obstacles based on the absolute coordinates of the acquisition vehicle and the relative coordinates of the selected obstacles, and to obtain the real labeling data of the selected obstacles based on the absolute coordinates of the selected obstacles.

In an embodiment, the simulation number acquisition module 30 includes:

a labeling data searching unit, configured to search for real labeling data of the acquisition vehicle at the vehicle labeled position identical or adjacent to the position to be simulated; and a simulation number calculating unit, configured to retrieve a point cloud to which the real labeling data of the acquisition vehicle as searched belongs, and to determine the number of the obstacles in the retrieved point cloud as the number of the obstacles to be simulated.

As shown in FIG. 3, in an embodiment, the device further includes:

an obstacle collision detection module 80, configured to determine real labeling data of candidate obstacles in the range, to select an obstacle model from an obstacle model library, based on the real labeling data of the candidate obstacles, and to determine whether adjacent candidate obstacles are overlapped by using the obstacle model; and to delete one of the overlapped candidate obstacles, in a case that the adjacent candidate obstacles are overlapped.

Third Embodiment

Figure 4:
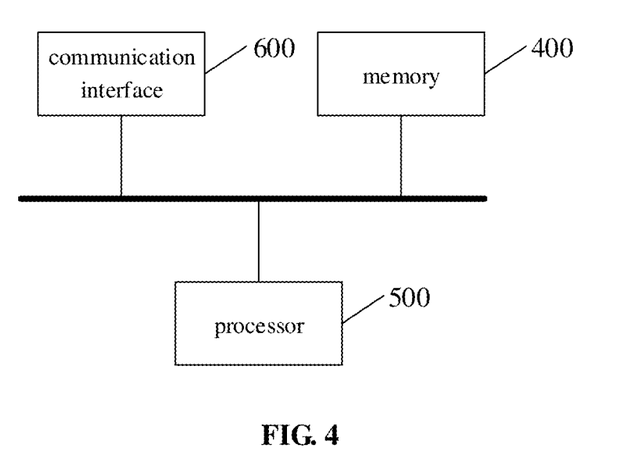
FIG. 4 is a schematic diagram of a terminal for simulating a distribution of obstacles according to an embodiment of the present disclosure.

As shown in FIG. 4, a terminal for simulating a distribution of obstacles is provided according to an embodiment of the present disclosure, which includes:

a memory 400 and a processor 500, wherein a computer program that can run on the processor 500 is stored in the memory 400; when the processor 500 executes the computer program, the method for simulating a distribution of obstacles according to the above embodiment is implemented; the number the memory 400 and the processor 500 may each be one or more; and a communication interface 600, configured to enable the memory 400 and the processor 500 to communicate with an external device.

The memory 400 may include a high-speed RAM memory, or may also include a non-volatile memory, such as at least one disk memory.

If the memory 400, the processor 500 and the communication interface 600 are implemented independently, the memory 400, the processor 500 and the communication interface 600 may be connected to each other via a bus so as to realize mutual communication. The bus may be an industry standard architecture (ISA) bus, a peripheral component interconnect (PCI) bus, an extended industry standard architecture (EISA) bus, or the like. The bus may be categorized into an address bus, a data bus, a control bus or the like. For ease of illustration, only one bold line is shown in FIG. 4 to represent the bus, but it does not mean that there is only one bus or only one type of bus.

Optionally, in a specific implementation, if the memory 400, the processor 500 and the communication interface 600 are integrated on one chip, then the memory 400, the processor 500 and the communication interface 600 can complete mutual communication through an internal interface.

Fourth Embodiment

According to an embodiment of the present disclosure, it is provided a non-volatile computer readable storage medium having a computer program stored thereon which, when executed by a processor, implements the method for simulating a distribution of obstacles described in any of the above embodiments.

In the present specification, the description referring to the terms "one embodiment", "some embodiments", "an example", "a specific example", or "some examples" or the like means that the specific features, structures, materials, or characteristics described in connection with the embodiment or example are contained in at least one embodiment or example of the present disclosure. Moreover, the specific features, structures, materials, or characteristics described may be combined in a suitable manner in any one or more of the embodiments or examples. In addition, various embodiments or examples described in the specification as well as features of different embodiments or examples may be united and combined by those skilled in the art, as long as they do not contradict with each other.

Furthermore, terms "first" and "second" are used for descriptive purposes only, and are not to be construed as indicating or implying relative importance or implicitly indicating the number of recited technical features. Thus, a feature defined with "first" and "second" may include at least one said feature, either explicitly or implicitly. In the description of the present disclosure, the meaning of "a plurality" is two or more than two, unless otherwise explicitly or specifically indicated.

Any process or method described in the flowcharts or described otherwise herein may be construed as representing a module, segment or portion including codes for executing one or more executable instructions for implementing particular logical functions or process steps. The scope of the preferred embodiments of the present disclosure includes additional implementations in which functions may be implemented in an order that is not shown or discussed, including in a substantially concurrent manner or in a reverse order based on the functions involved. All these should be understood by those skilled in the art to which the embodiments of the present disclosure belong.

The logics and/or steps represented in the flowcharts or otherwise described herein for example may be considered as an ordered list of executable instructions for implementing logical functions. They can be specifically embodied in any computer readable medium for use by an instruction execution system, apparatus or device (e.g., a computer-based system, a system including a processor, or another system that can obtain instructions from the instruction execution system, apparatus or device and execute these instructions) or for use in conjunction with the instruction execution system, apparatus or device. For the purposes of the present specification, "computer readable medium" can be any means that can contain, store, communicate, propagate or transmit programs for use by an instruction execution system, apparatus or device or for use in conjunction with the instruction execution system, apparatus or device. More specific examples (non-exhaustive list) of computer readable storage medium at least include: electrical connection parts (electronic devices) having one or more wires, portable computer disk cartridges (magnetic devices), random access memory (RAM), read only memory (ROM), erasable programmable read-only memory (EPROM or flash memory), fiber optic devices, and portable read only memory (CDROM). In addition, the computer-readable storage medium may even be a paper or other suitable medium on which the programs can be printed. This is because for example the paper or other medium can be optically scanned, followed by editing, interpretation or, if necessary, other suitable ways of processing so as to obtain the programs electronically, which are then stored in a computer memory.

It should be understood that individual portions of the present disclosure may be implemented in the form of hardware, software, firmware, or a combination thereof. In the above embodiments, a plurality of steps or methods may be implemented using software or firmware stored in a memory and executed by a suitable instruction execution system. For example, if they are implemented in hardware, as in another embodiment, any one or a combination of the following techniques known in the art may be used: discrete logic circuits having logic gate circuits for implementing logic functions on data signals, application-specific integrated circuits having suitable combined logic gate circuits, programmable gate arrays (PGA), field programmable gate arrays (FPGA), etc.

Those skilled in the art may understand that all or part of the steps carried in the method of the foregoing embodiments may be implemented by using a program to instruct the relevant hardware, and the program may be stored in a computer readable storage medium. When executed, the program includes one or a combination of the steps in the method embodiments.

In addition, individual functional units in various embodiments of the present disclosure may be integrated in one processing module, or individual units may also exist physically and independently, or two or more units may also be integrated in one module. The above integrated module can be implemented in the form of hardware or in the form of a software functional module. The integrated module may also be stored in a computer readable storage medium if it is implemented in the form of a software function module and sold or used as a stand-alone product. The storage medium may be a read-only memory, a magnetic disk or an optical disk, etc.

The above description only relates to specific embodiments of the present disclosure, but the scope of protection of the present disclosure is not limited thereto, and any of those skilled in the art can readily contemplate various changes or replacements within the technical scope of the present disclosure. All these changes or replacements should be covered by the scope of protection of the present disclosure. Therefore, the scope of protection of the present disclosure should be determined by the scope of the appended claims.

What is claimed is:

1. A method for simulating a distribution of obstacles, comprising:
    acquiring a plurality of point clouds of a plurality of frames, wherein each point cloud comprises a plurality of original obstacles;
    acquiring real labeling data of an acquisition vehicle, and obtaining data of a simulation position of the acquisition vehicle based on the real labeling data of the acquisition vehicle and a movement rule of the acquisition vehicle, wherein the real labeling data of the acquisition vehicle is obtained through labeling the acquisition vehicle by absolute coordinates of the acquisition vehicle as vehicle labeled positions;
    determining the number of obstacles to be simulated based on the data of the simulation position of the acquisition vehicle;
    selecting the determined number of obstacles to be simulated, from a range with the simulation position of the acquisition vehicle as a center, wherein the range is less than or equal to a maximum scanning range of the acquisition vehicle; and
    acquiring real labeling data of the selected obstacles, and obtaining a position distribution of the selected obstacles based on the real labeling data of the selected obstacles;
    wherein the determining the number of obstacles to be simulated based on the data of the simulation position of the acquisition vehicle comprises:
    searching for real labeling data of the acquisition vehicle, from the acquired real labeling data of the acquisition vehicle, corresponding to a vehicle labeled position identical with the simulation position of the acquisition vehicle; and if the real labeling data of the acquisition vehicle corresponding to the vehicle labeled position identical with the simulation position of the acquisition vehicle is not found, searching for real labeling data of the acquisition vehicle, from the acquired real labeling data of the acquisition vehicle, corresponding to the vehicle labeled position adjacent to the simulation position of the acquisition vehicle; and
    retrieving a point cloud to which the searched real labeling data of the acquisition vehicle belongs, and determining the number of the obstacles in the retrieved point cloud as the number of the obstacles to be simulated.

2. The method of claim 1, wherein the acquiring real labeling data of an acquisition vehicle comprises:
    acquiring the absolute coordinates of the acquisition vehicle in a world coordinate system; and
    labeling the acquisition vehicle by the absolute coordinates of the acquisition vehicle to obtain the real labeling data of the acquisition vehicle.

3. The method of claim 2, wherein the acquiring real labeling data of the selected obstacles comprises:
    calculating relative coordinates of the selected obstacles in a coordinate system of the point cloud;
    calculating absolute coordinates of the selected obstacles based on the absolute coordinates of the acquisition vehicle and the relative coordinates of the selected obstacles; and obtaining the real labeling data of the selected obstacles based on the absolute coordinates of the selected obstacles.

4. The method of claim 1, wherein before the selecting the determined number of obstacles to be simulated, from a range with the simulation position of the acquisition vehicle as a center, the method further comprises:
determining real labeling data of candidate obstacles in the range;
selecting an obstacle model from an obstacle model library, based on the real labeling data of the candidate obstacles; and
determining whether adjacent candidate obstacles are overlapped by using the obstacle model; and deleting one of the overlapped candidate obstacles in a case that the adjacent candidate obstacles are overlapped.

5. A device for simulating a distribution of obstacles, comprising:
one or more processors;
a storage device for storing one or more programs; wherein
the one or more programs are executed by the one or more processors to enable the one or more processors to:
acquire a plurality of point clouds of a plurality of frames, wherein each point cloud comprises a plurality of original obstacles;
acquire real labeling data of an acquisition vehicle, and to obtain data of a simulation position of the acquisition vehicle based on the real labeling data of the acquisition vehicle and a movement rule of the acquisition vehicle, wherein the real labeling data of the acquisition vehicle is obtained through labeling the acquisition vehicle by absolute coordinates of the acquisition vehicle as vehicle labeled positions;
determine the number of obstacles to be simulated based on the data of the simulation position of the acquisition vehicle;
select the determined number of obstacles to be simulated, from a range with the simulation position of the acquisition vehicle as a center, wherein the range is less than or equal to a maximum scanning range of the acquisition vehicle; and
acquire real labeling data of the selected obstacles, and obtain a position distribution of the selected obstacles based on the real labeling data of the selected obstacles;
wherein the one or more programs are executed by the one or more processors to enable the one or more processors to:
search for real labeling data of the acquisition vehicle, from the acquired real labeling data of the acquisition vehicle, corresponding to a vehicle labeled position identical with the simulation position of the acquisition vehicle; and if the real labeling data of the acquisition vehicle corresponding to the vehicle labeled position identical with the simulation position of the acquisition vehicle is not found, search for real labeling data of the acquisition vehicle, from the acquired real labeling data of the acquisition vehicle, corresponding to the vehicle labeled position adjacent to the simulation position of the acquisition vehicle; and
retrieve a point cloud to which the searched real labeling data of the acquisition vehicle belongs, and determine the number of the obstacles in the retrieved point cloud as the number of the obstacles to be simulated.

6. The device of claim 5, wherein the one or more programs are executed by the one or more processors to enable the one or more processors to:
acquire the absolute coordinates of the acquisition vehicle in a world coordinate system, and label the acquisition vehicle by the absolute coordinates of the acquisition vehicle to obtain the real labeling data of the acquisition vehicle.

7. The device of claim 6, wherein the one or more programs are executed by the one or more processors to enable the one or more processors to:
calculate relative coordinates of the selected obstacles in a coordinate system of the point cloud, calculate absolute coordinates of the selected obstacles based on the absolute coordinates of the acquisition vehicle and the relative coordinates of the selected obstacles, and obtain the real labeling data of the selected obstacles based on the absolute coordinates of the selected obstacles.

8. The device of claim 5, wherein the one or more programs are executed by the one or more processors to enable the one or more processors to:
determine real labeling data of candidate obstacles in the range, select an obstacle model from an obstacle model library, based on the real labeling data of the candidate obstacles, and determine whether adjacent candidate obstacles are overlapped by using the obstacle model; and delete one of the overlapped candidate obstacles in a case that the adjacent candidate obstacles are overlapped.

9. A non-transitory computer-readable storage medium having computer programs stored thereon, wherein the computer programs, when executed by a processor, cause the processor to perform operations of:
acquiring a plurality of point clouds of a plurality of frames, wherein each point cloud comprises a plurality of original obstacles;
acquiring real labeling data of an acquisition vehicle, and obtaining data of a simulation position of the acquisition vehicle based on the real labeling data of the acquisition vehicle and a movement rule of the acquisition vehicle; wherein the real labeling data of the acquisition vehicle is obtained through labeling the acquisition vehicle by absolute coordinates of the acquisition vehicle as vehicle labeled positions;
determining the number of obstacles to be simulated based on the data of the simulation position of the acquisition vehicle;
selecting the determined number of obstacles to be simulated, from a range with the simulation position of the acquisition vehicle as a center, wherein the range is less than or equal to a maximum scanning range of the acquisition vehicle; and
acquiring real labeling data of the selected obstacles, and obtaining a position distribution of the selected obstacles based on the real labeling data of the selected obstacles;
wherein when the computer programs, executed by a processor, cause the processor to determine the number of obstacles to be simulated based on the data of the simulation position of the acquisition vehicle, the computer programs, executed by a processor, cause the processor to perform operations of:
searching for real labeling data of the acquisition vehicle, from the acquired real labeling data of the acquisition vehicle, corresponding to a vehicle labeled position identical with the simulation position of the acquisition vehicle; and if the real labeling data of the acquisition vehicle corresponding to the vehicle labeled position identical with the simulation position of the acquisition vehicle is not found, searching for real labeling data of the acquisition vehicle, from the acquired real labeling data of the acquisition vehicle, corresponding to the vehicle labeled position adjacent to the simulation position of the acquisition vehicle; and retrieving a point cloud to which the searched real labeling data of the acquisition vehicle belongs, and determining the number of the obstacles in the retrieved point cloud as the number of the obstacles to be simulated.

* * * * *